(12) United States Patent
Ohba

(10) Patent No.: US 6,355,545 B1
(45) Date of Patent: *Mar. 12, 2002

(54) METHOD AND APPARATUS FOR WIRING, WIRE, AND INTEGRATED CIRCUIT

(75) Inventor: Takayuki Ohba, Yokohama (JP)

(73) Assignee: Semiconductor Leading Edge Technologies, Inc., Yokohama (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/539,710

(22) Filed: Mar. 31, 2000

(30) Foreign Application Priority Data

Jun. 3, 1999 (JP) .......................................... 11-155887

(51) Int. Cl.[7] .......................... H01L 21/28; H01L 21/44
(52) U.S. Cl. ...................... 438/570; 438/630; 438/680; 438/683; 438/603
(58) Field of Search ........................... 438/570, 2, 630, 438/680, 683, 907, 908, 653, 656, 685, 603, 604, 675

(56) References Cited

U.S. PATENT DOCUMENTS

| | | |
|---|---|---|
| 4,804,560 A | 2/1989 | Shioya et al. |
| 4,902,645 A | 2/1990 | Ohba |
| 5,066,612 A | 11/1991 | Ohba et al. |
| 5,232,872 A | 8/1993 | Ohba |
| 5,264,038 A | 11/1993 | Hara et al. |
| 5,393,565 A | 2/1995 | Suzuki et al. |
| 5,478,780 A * | 12/1995 | Koerner et al. ............. 438/653 |
| 5,522,412 A | 6/1996 | Ohba et al. |
| 6,077,571 A * | 6/2000 | Kaloyeros et al. .......... 427/576 |

FOREIGN PATENT DOCUMENTS

| | | |
|---|---|---|
| JP | 4196418 | 7/1992 |
| JP | 8213343 | 8/1996 |
| JP | 9186102 | 7/1997 |
| JP | 9205070 | 8/1997 |
| JP | 11217672 | 8/1999 |

* cited by examiner

Primary Examiner—Matthew Smith
Assistant Examiner—Igwe U. Anya

(57) ABSTRACT

The present invention provides a method for wiring, which plugs conductive material sufficiently into a via hole produced in dielectronics (hereinafter, referred to as "a via hole") and prevents generating a void. The via hole is made through a via hole patterning step and a cleaning step. At a surface treatment step, substance having chemical affinity (active site) is adsorbed to the surface of the via hole. Next, an electron donative layer is made by depositing substance having an electron donative characteristic on the active sites acting as cores at an electron donative layer formation step. Then, the wiring material is plugged at a via hole plug step.

3 Claims, 5 Drawing Sheets

METHOD AND APPARATUS FOR WIRING, WIRE, AND INTEGRATED CIRCUIT

BACKGROUND OF THE INVENTION

1. Field of the Invention

The present invention relates to a method and an apparatus for wiring, a wire and an integrated circuit. In particular, the invention relates to, for example, a method and an apparatus for wiring whose material is plugged sufficiently so as to prevent generation of a void or to prevent disconnection, a wire and an integrated circuit having the wire.

2. Description of the Related Art

Recently, semiconductor devices have been integrated so highly that a designing rule of nanometer level has been applied to a design of integrated semiconductor devices instead of the designing rule of micron level (e.g., The National Technology Roadmap for Semiconductors Technology Needs, SIA, 1997 edition). A multi-layered wiring structure including wires made on each layer of multiple layers has been utilized to integrate semiconductor devices. An electric interconnection among these wires made on the multiple layers inserting an interlayer dielectronics is connected by plugging conductive material into a hole (hereinafter, referred to as "a via hole") produced in the dielectronics. This is called as a plugged wiring (also called as "a vertical wiring", hereinafter). Here, the via hole includes a contact hole and a via hole.

To produce the above vertical wiring, a thin film deposition technique is utilized such as physical vapor deposition method (PVD method) or chemical vapor deposition method (CVD method). The PVD method is roughly explained by the following: first, plasma is made from argon gas, etc., and voltage is impressed to the plasma to accelerate. The accelerated Ar ion comes into collision with target material, and then atoms come out of the target material to be plugged (This is so-called sputtering). Plugging is performed by adsorbing atoms come out of the target material to the via hole. The CVD method is simply described as the method of forming a thin film made from precursors supplied as gas by chemical reaction on the surface of a substrate film.

These years, shrink of devices has been done to make highly integrated devices. And small feature of multilevel interconnects (=wire) have made progress to draw maximum capacity according to the shrink. Because of shrink of the wire and unchanged thickness of dielectrics layer, a ratio of vertical and/or lateral size of interconnects including dielectrics must be changed. Therefore, as compared with a conventional via hole, a ratio of depth and diameter (aspect ratio) is changed. Namely, the aspect ratio becomes large according to the shrink. For example, in case of 4 G bit DRAM, the aspect ratio becomes 6 through 8 at maximum.

There is a problem that it is difficult to plug the wiring material sufficiently into the via hole having a large aspect ratio using the conventional PVD method or CVD method. FIG. 7 shows a void formation generated by insufficient deposition method. In FIG. 7, a via hole 10 is provided for an electric interconnection between a wire A and a wire B through dielectronics C. Accordingly, it is desired that wiring material 101 is plugged into the via hole 10 with no voids. However, the conventional plugging method does not work sufficiently, which causes to generate a void 102. This may further cause a problem to increase interconnect resistance or in a worse case, to generate disconnection. The problem is brought by poor stepcoverage, i.e., a metal film is made nonuniformly on the side surface of the via hole 10 at an initial stage of deposition. In a worse case, the metal film is not made on the side surface of the via hole 10.

Stepcoverage depends on "wettability" between an atom or a molecule of the surface of the via hole 10 and an atom or a molecule of the wiring material to be plugged whether it is possible to plug the wiring material sufficiently into the via hole 10 without generating a void. Accordingly, the surface of the via hole is generally improved so as to have good wettability. A very thin metal film consisting of the wiring material is formed to be used for an initial growth surface. This method provides the same effect as improvement of the surface. In this case, the thin metal film is called "Wetting layer". Namely, the wetting layer is formed to plug the wiring material sufficiently afterwards. The above "wettability" is determined based on chemical affinity of the surface of solid.

However, when the wetting layer having good wettability is formed nonuniformly on the side surface of the via hole 10, it is difficult to plug the wiring material sufficiently. As a result, the void 102 is generated. This is because the PVD method cannot plug the wiring material sufficiently because of geometric reason. When the CVD method is applied to the wetting layer formed nonuniformly, it occurs a difference in the speed of forming film according to nonuniformity of the wetting layer. This is because the speed of forming film is relatively proportional to the density of the wetting layer formed on the surface. Accordingly, the wiring material is formed better at a region having higher speed of forming film. As a result, the via hole 10 is closed, which prevents the wiring material from being supplied inside of the via hole. Therefore, the wiring material cannot be plugged sufficiently.

As has been described, it is impossible to plug the wiring material sufficiently using the conventional plugging method. Therefore, there is a problem to generate a void, which causes to increase interconnect resistance, and in a worse case, to generate disconnection.

The present invention is provided to solve the above problems of the conventional methods. The invention aims, for example, to prevent increase of the interconnect resistance or disconnection due to the generation of a void by forming the initial growth surface (wetting layer) uniformly and plugging the wiring material sufficiently.

Further, the invention aims to improve the reliability of conductibility in the wire by preventing increase of the interconnect resistance or disconnection due to the generation of a void.

Yet further, the invention aims to provide a reliable plugged wiring (vertical wiring) to draw capacity of an integrated circuit comprising high-integrated semiconductor devices.

SUMMARY OF THE INVENTION

The main object of the invention is, for example, to make the initial growth surface (wetting layer) uniformly on the surface of the via hole. To make the initial growth surface uniformly, however, a substrate on which the initial growth surface is made should be produced uniformly. Accordingly, to make the initial growth surface uniformly requires to produce the substrate uniformly at a previous stage of the forming step of initial growth surface. The present invention is directed to this requirement.

According to the present invention, a method for wiring includes a step of treating a surface of a via hole produced in dielectronics to provide the surface with chemical affinity, and a step of plugging wiring material into the via hole having the surface treated.

Further, according to another aspect of the present invention, an apparatus for wiring includes a surface treatment unit for treating a surface of a via hole produced in dielectronics to provide the surface with chemical affinity; and a plug unit for plugging wiring material into the via hole having the surface treated.

Further, according to another aspect of the present invention, a wire includes dielectronics having a via hole whose surface has been treated to have chemical affinity; and wiring material plugged into the via hole.

Yet further, according to another aspect of the present invention, an integrated circuit having a plurality of semiconductor devices, a plurality of wires for connecting electrically the plurality of semiconductor devices and located in respective layers of a plurality of layers having an interlayer consisting of dielectronics, and a vertical wiring for connecting electrically the plurality of wires located in the plurality of layers having the interlayer consisting of dielectronics, the integrated circuit includes the dielectronics and the vertical wiring having wiring material plugged into the via hole.

BRIEF DESCRIPTION OF THE DRAWINGS

A complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENT

In the following, one embodiment according to the invention will be described when applied to a producing process of an integrated circuit (hereinafter, referred to as "IC"), for example. can be divided into "front-end process" and "back-end process". "Front-end process" is a process for providing an IC element on the wafer. On the other hand, "back-end process" is a process for electrically connecting the IC elements on the wafer. The present invention can be applied to the "back-end process".

Figure 1:
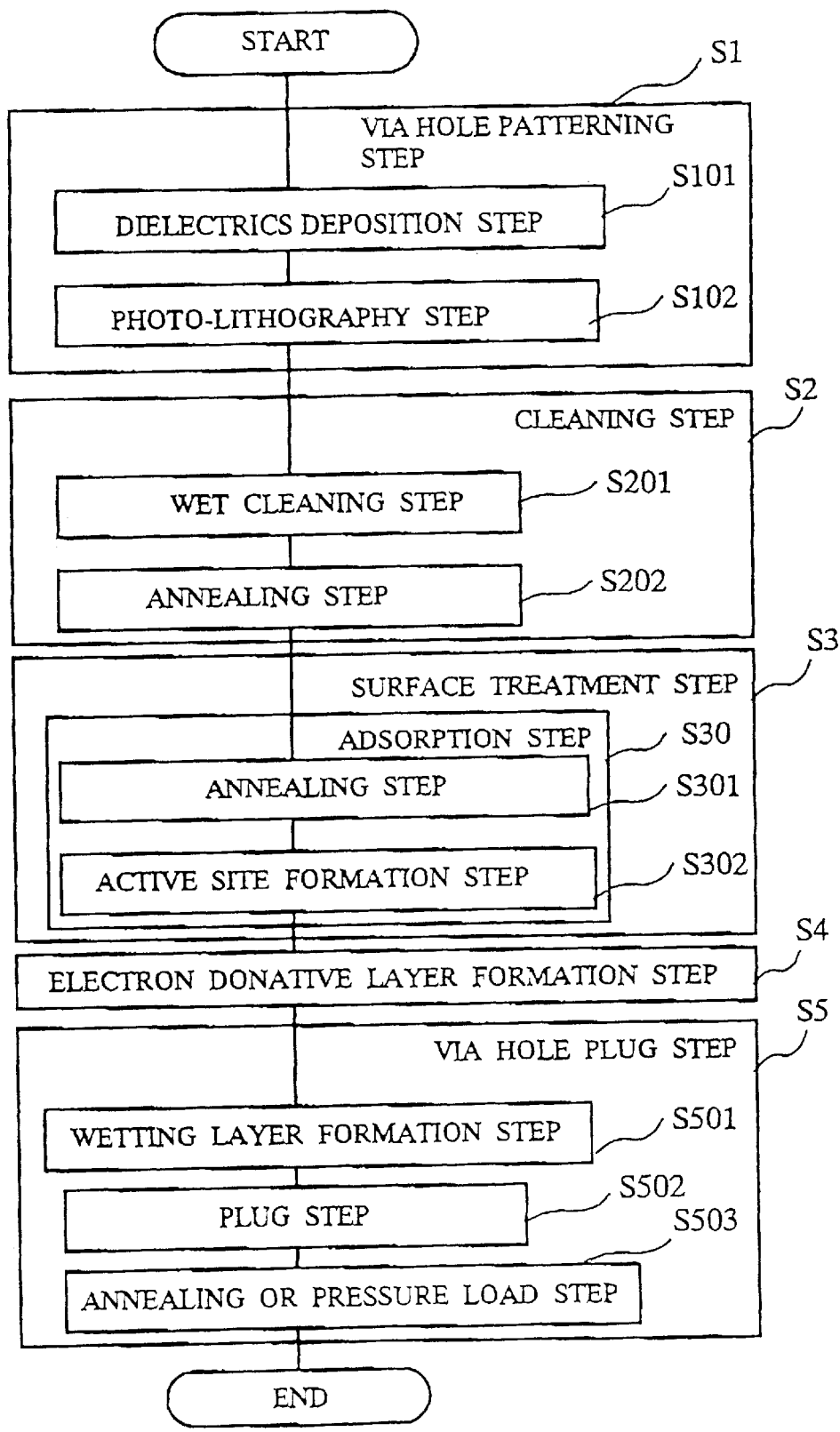
FIG. 1 is a flowchart showing a method for wiring according to an embodiment of the present invention.

As shown in FIG. 1, the embodiment according to the invention is performed after a via hole patterning step S1 and a cleaning step S2. The via hole patterning step S1 is provided for producing the via hole in a dielectric layer (a film of dielectronics). Secondly, the cleaning step S2 is provided for removing soil on the wafer such as contaminant and impurities remained after the via hole is patterned.

The via hole patterning step S1 includes a dielectrics deposition step S101 for depositing a dielectric layer on a surface of the wafer and a photo-lithography step S102 for producing the via hole by photo-lithographing technique in the dielectric layer formed at the dielectrics deposition step S101.

The cleaning step S2 includes a wet cleaning step S201 for removing soil such as contaminant and impurities to increase yield. Further, the cleaning step S2 includes an annealing (degas) step S202 for preventing oxidation in a wiring process (a surface treatment step S3, an electron donative layer formation step S4, and a via hole plug step S5).

The embodiment of the invention includes the surface treatment step S3 for providing the surface of the via hole with chemical affinity after the cleaning step S2 as shown in FIG. 1. The chemical affinity shows a degree of invention, a term "chemical affinity" is used so as to show that a certain substance having an unpaired electron or an ionized substance is apt to give rise to chemical reaction more easily than a substance without an unpaired electron or unionized substance. When only one electron occupies one atomic (molecular) orbital, the only one electron is called "an unpaired electron". Normally, the atomic (molecular) orbital can be occupied by two electrons whose spin directions are opposite each other. Accordingly, substance having the unpaired electron can include another electron on its atomic (molecular) orbital. In other words, substance having the unpaired electron is easy to react chemically, that is, the substance has large chemical affinity. The above ionization includes polarizing which is caused by that a covalent electron pair is attracted to an atom having large electro-negativity because of difference in the electro-negativity between atoms in the molecule.

The surface treatment step S3 has an adsorption step S30 for adsorbing substance to the surface of the dielectronics as shown in FIG. 1. This adsorption step S30 includes, at first, an annealing step S301 for annealing the dielectronics having the via hole. The annealing step S301 is necessary for dissociating precursors supplied hereinafter. Here, the dissociation means to resolve one molecule into atoms or atomic group.

Secondly, the adsorption step S30 includes an active site formation step S302 for supplying and diffusing the precursors of substance to be adsorbed chemically to the dielectronics composing the surface of the via hole. The precursors diffused at the active site formation step S302 dissociates by S301, and the dissociated substance adsorbs to the dielectronics chemically. Here, "chemical adsorption" means an adsorption bonding chemically by exchanging an electron or by forming a hybridized orbital between the atom (molecule) composing the surface of the via hole and the atom (molecule) adsorbed on the surface of the via hole. The surface treatment step S3 configured as described above enables to adsorb the substance chemically to the surface of the via hole. Namely, the adsorbed substance is ionized or has an unpaired electron by donating an electron from the adsorbed substance to the substance on the surface of the via hole. The substance can also be ionized or have an unpaired electron by an inverse phenomenon, namely, by donating an electron from the substance on the surface of the via hole to the adsorbed substance. Hereinafter, this ionized substance or the substance having an unpaired electron is called an active site. In the above way, the chemical affinity can be provided to the surface of the via hole.

To make the film donating an electron uniformly at the electron donative layer formation step S4 described below or to make the wetting layer uniformly at the via hole plug step described below, the density of the substance (active site)

adsorbed chemically at the surface treatment step S3 is desired to be equal to or more than 12 power of 10 per 1 square centimeter. Normally, the atomic density of the surface of solid is around 15 power of 10 per 1 square centimeter. In other words, the adsorption is desired to be performed so that the density of the adsorbed substance becomes equal to or more than 1/1000 to the atomic density of the surface of the via hole.

The above-described surface treatment step S3 aims to provide the substance or the substance having an unpaired electron (active site) chemically. Namely, it is possible to eliminate the annealing step S301 if the above object is accomplished. For example, the above object can be accomplished in another way such that plasma is generated by using high-frequency wave and the plasma is supplied to the surface of the via hole. Therefore, the dissociation also means that one molecule is resolved into ions of atoms or atomic group composing the molecule.

It is desirable for the precursors supplied at the active site formation step S302 to be such a substance that is ionized or comes to have an unpaired electron by adsorbing to the dielectronics composing the surface of the via hole chemically. From this point of view, the following substances are desired for the precursors:

(a) a hydrogen atom or a hydrogen molecule;
(b) a hydride, an organic compound or a complex compound of B (boron), C (carbon), N (nitrogen), P (phosphorus), Si (silicon), Ge (germanium), As (arsenic), Mg (magnesium), Ta (tantalum), Nb (niobium), W (tungsten), Ni (nickel), Cu (copper), Ag (silver), Au (gold);
(c) a hydride, an organic compound or a complex compound composed of diatomic molecule of B, C, N, P, Si, Ge, As, Mg, Ta, Nb, W, Ni, Cu, Ag, and Au;
(d) a halogenide of B, C, N, P, Si, Ge, As, Mg, Ta, Nb, W, Ni, Cu, Ag, and Au; or a halogenide composed of diatomic molecule of B, C, N, P, Si, Ge, As, Mg, Ta, Nb, W, Ni, Cu, Ag, and Au;
(e) a cyclic hydride;
(g) a complex compound.

The hydrogen atom shown in the above (a) has only one electron on the atomic orbital. Namely, as the hydrogen atom has an unpaired electron, it is apt to adsorb to the surface of the via hole chemically. Further, electro-negativity of hydrogen is relatively smaller than silicon atom (Si) or oxygen atom (O). Therefore, the chemically adsorbed hydrogen atom is polarized (is ionized) and can provide the surface of the via hole with the chemical affinity.

When the electro-negativity of the hydrogen included in the hydrides listed in the above (b), (c) and (e) is smaller than the electro-negativity of another element, the hydrogen has positive electricity. Further, one of two electrons occupying the molecular orbital of the hydrides is used for bonding with an atom composing the dielectronics, and the other electron becomes an unpaired electron. Accordingly, the hydrides can provide the surface of the via hole with the chemical affinity.

The substances listed in the above (d) can provide the surface of the via hole with the chemical affinity. First, halogen is a general term for 5 elements belonging to 7B of the periodic table, which are fluorine, chlorine, bromine, iodine, and astatine. The halogen has 7 valence electrons on the outermost shell, which means one electron is missing as compared with the maximum number 8 of valence electrons. The atom which includes the maximum number of valence electrons on the outermost shell is stable, therefore, the halogen tends to receive another electron from other atom. Namely, the electro-negativity of halogen is larger than the electro-above (d) is polarized because of its structure. Therefore, the halogenides can provide the surface of the via hole with the chemical affinity.

Next, the embodiment of the invention has the electron donative layer formation step S4 as shown in FIG. 1. The electron donative layer formation step S4 is a process for forming a layer having a characteristic donating an electron to a compound including the wiring material (for example, copper or aluminum). Namely, the process makes the layer donating an electron by using the substance adsorbed at the surface treatment step S3 as a core. This layer donates an electron to the precursors for the CVD method which will be used at a wetting layer formation step S501 described later, and this layer causes the precursors used in the CVD method to disproportionate. In other words, the electron donative layer formation step S4 is a process for making a layer having the above characteristic to facilitate to make up the wiring material at the wetting layer formation step S501.

Further, in the CVD method, substrate should be uniform in a premise. Since the substance having chemical affinity (active site) is provided sufficiently by the above surface treatment step S3, the layer (substrate) can be made uniformly at the electron donative layer formation step S4.

The disproportionation used in the CVD method mentioned above means that at least two molecules of one kind react mutually such as oxidation, reduction and so on and as a result, at least two kinds of substances are generated. For example, the above definition will be copper (Cu): univalent plus ion $Cu^+$; and bivalent plus ion $Cu^{2+}$. Here, the disproportionation is that when an electron is donated/received to/from two univalent plus ions $Cu^+$, one $Cu^+$, becomes oxidized into $Cu^{2+}$ and the other $Cu^+$ becomes reduced into Cu. The oxidation is a reaction to lose an electron, and the reduction is a reaction to gain an electron. Therefore, to disproportionate, it is required to be a substance to become bivalent ion at least.

The layer made at the electron donative layer formation step S4 has characteristics to be ionized at least bivalent ion and to cause the precursors for the CVD method to disproportionate by donating an electron to the precursors for the CVD method used at the via hole plug step S5. Concrete examples of substances suitable for the electron donative layer are the following atoms, compound of the atoms with Si (silicon), compound of the atoms with B (boron), and compound of the atoms with N (nitrogen): Mg (magnesium); Al (aluminum); P (phosphorus); S (sulfur); Ti (titanium); V (vanadium); Cr (chrome); Mn (maganese); Co (cobalt); Ni (nichel); Cu (copper); Nb (niobium); Mo (molybdenum); Ag (silver); Hg (mercury); Ta (tantalum); W (tungsten); Pt (platinum); and Au (gold).

As described above, the layer made at the electron donative layer formation step S4 is a film having a characteristic to cause the precursors for the CVD method to disproportionate by donating an electron to the precursors for the CVD method used at the via hole plug step S5. However, in short, it is sufficient for the film to have a characteristic to cause the precursors for the CVD method used at the via hole plug step S5 to to reduce activation energy for disproportionation can be replaced with the electron donative layer formation step S4.

Next to the above step, the embodiment of the invention has a via hole plug step S5 as shown in FIG. 1. This via hole plug step S5 is a process for plugging conductive wiring material into the via hole. The via hole plug step S5 includes a wetting layer formation step S501 for forming an initial growth surface having good wettability (wetting layer). Then, the via hole plug step S5 has a plug step S502 for plugging the wiring material by the CVD method, the PVD method, a plating method, etc.

Further, after plugging the wiring material, the via hole plug step S5 has an annealing or pressure load step S503 for annealing or pressuring the plugged material. Generally, the plugged wiring material includes internal distortions due to the dislocation and so on. Because the wiring material in such status has high energy, the such status should relax into the status without internal distortion. In this relaxing process, characteristics of the film such as electric conductivity change. Accordingly, to obtain stable electric conductivity, relaxing process is required to perform promptly. The relaxation can progress at room temperature, however, it takes a large amount of time to relax at room temperature. On the other hand, heating or pressuring makes the relaxation progress quickly. Namely, to relax the internal distortion in a short time, heating or pressuring is applied.

The embodiment of the invention is configured as has been described above, and an operation and an effect will be explained in the following.

Figure 2:
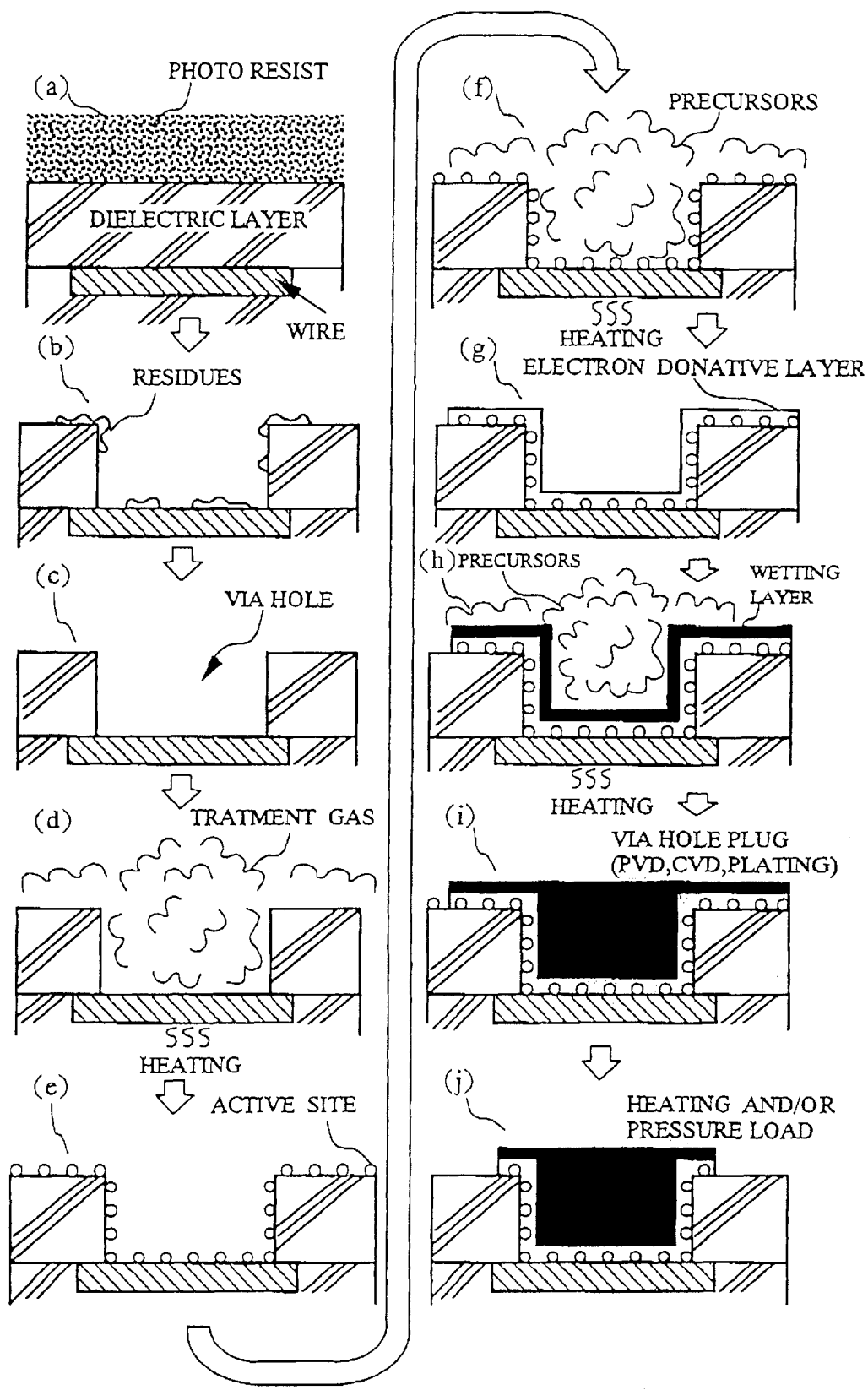
FIG. 2 shows process steps of wiring according to the embodiment.

As shown in (a) of FIG. 2, an interlayer dielectric film is formed on the hole is patterned on the dielectric layer by a technique of photolithography as shown in (b) of FIG. 2 (via hole patterning step S1). Then, a soil or contaminant remained after patterning the via hole is cleaned and moisture is removed by heating as shown in (c) of FIG. 2 (cleaning step S2)

Next, as shown in (d) of FIG. 2, the dielectronics having the via hole is heated, and treatment gas of the precursors which is adsorbed chemically to the dielectronics of the surface of the via hole is diffused over the surface of the dielectronics. When the treatment gas is contacted with the heated surface of the via hole, the gas is given an energy from the heated dielectronics, and the chemical bond of the gas is disconnected to result in decomposition. The substance generated by the decomposition is adsorbed chemically to an atom of the surface of the via hole to become an active site as shown in (e) of FIG. 2 (surface treatment step S3).

Then, a film consisting of substance having an electron donative characteristic is deposited by the CVD method. The surface of the dielectronics is heated as shown in (f) of FIG. 2, and the precursor gas is supplied. Consequently, the precursors is decomposed and the substance having an electron donative characteristic is generated by the chemical reaction. As shown in (g) of FIG. 2, the substance having an electron donative characteristic grows around the active site having the chemical affinity and acting as a core. As a sufficient number of active sites are provided, the film can be made uniformly (the electron donative layer formation step S4).

Then, the wetting layer is formed by the CVD method. Namely, as precursors is supplied to generate the wiring material by disproportionation. When the precursors is contacted with the surface of the via hole, an electron is supplied from the electron donative layer, which causes disproportionation. Consequently, the wiring material generated by the disproportionation is made on the surface of the electron donative layer. Then, as shown in (i) of FIG. 2, the wiring material is plugged by the PVD method, the CVD method, the plating method, and so on. After plugging the material, heating or pressure load process is performed as shown in (j) of FIG. 2 to eliminate atomic defect (via hole plug step S5).

The above embodiment includes the electron donative layer formation step S4. This step is necessary to cause the precursors used at the via hole plug step S5 to disproportionate by donating the electron and necessary to form the film having good "wettability" for the wiring material to be plugged thereafter. Further, if the via hole plug step S5 is processed without previously performing the electron donative layer formation step S4, the dielectronics reacts with the wiring material to generate nonconductive oxide, which increases the interconnect resistance. Namely, the electron donative layer formation step S4 is necessary for preventing a direct chemical reaction between the wiring material and the dielectronics.

However, the present invention includes the surface treatment step S3 for making the active site which becomes a core for forming the film on the surface of the dielectronic layer. Accordingly, in case a sufficient number of active sites are made to prevent chemical reaction between the wiring material and the dielectronics, the electron donative layer formation shown in FIG. 3.

Figure 3:
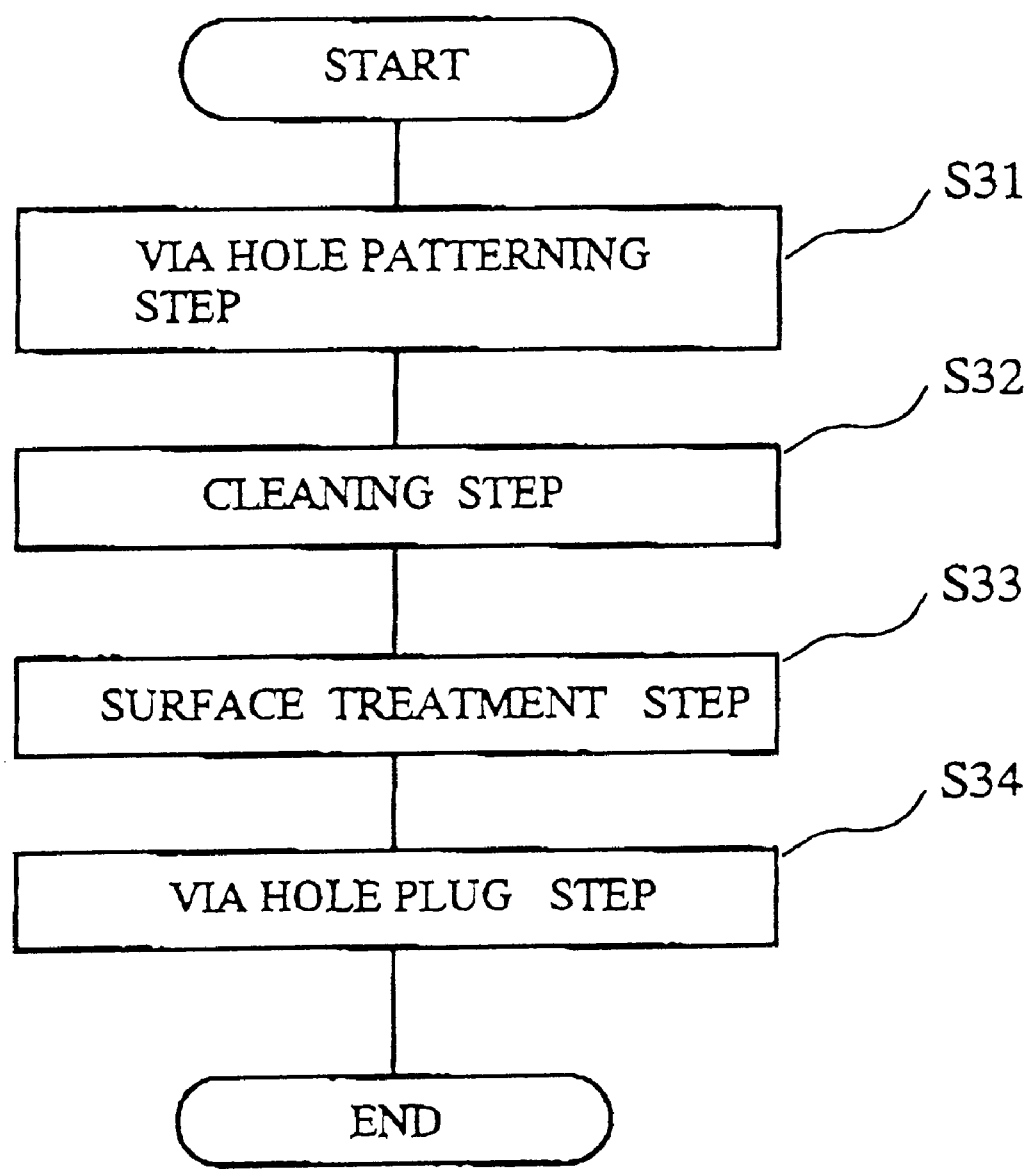
FIG. 3 is a flowchart showing another method for wiring modified from the embodiment.

In FIG. 3, at a surface treatment step S33, the active sites are made on the surface of the via hole produced through a via hole patterning step S31 and a cleaning step S32. And the active sites provide the surface of the via hole with the chemical affinity. The electron donative layer formation step is omitted, and the plugged wiring (vertical wiring) can be made by a via hole plug step S34.

In another way, the wetting layer formation step S501 included in the via hole plug step S5 shown in FIG. 1 is not always required, but the plug step can be started without the wetting layer formation step. Further, the step S503 for annealing or pressure load is not always required. Namely, when the change of the electric conductivity due to the relaxation does not generate so many problems, the annealing or pressure load step can be omitted.

EXAMPLE

Figure 4:
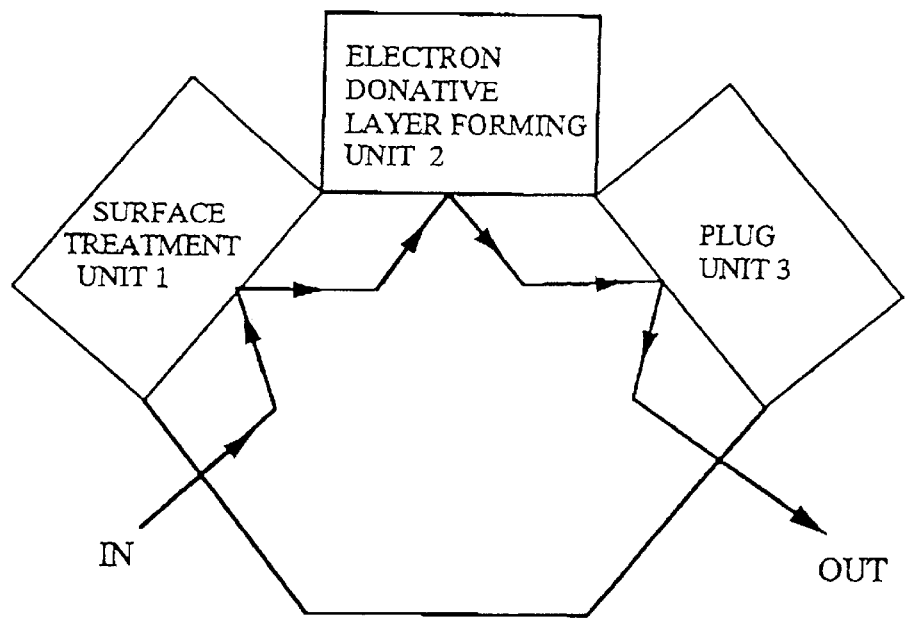
FIG. 4 shows a configuration of an apparatus for wiring according to an example of the present invention.

In the following, an example case that the embodiment of the invention is applied to plugging Cu (copper) or Al (aluminum) will be explained. As shown in FIG. 4, an apparatus for wiring according to the present invention has a surface treatment unit 1, an electron donative layer forming unit 2, and a plug unit 3. Each unit can control heating and pressuring.

Arrows in FIG. 4 show the path for carrying a wafer to make a wire thereon. The wafer provided with a via hole in an interlayer dielectric film produced on the wafer, and the wafer is carried out from "OUT".

Figure 5:
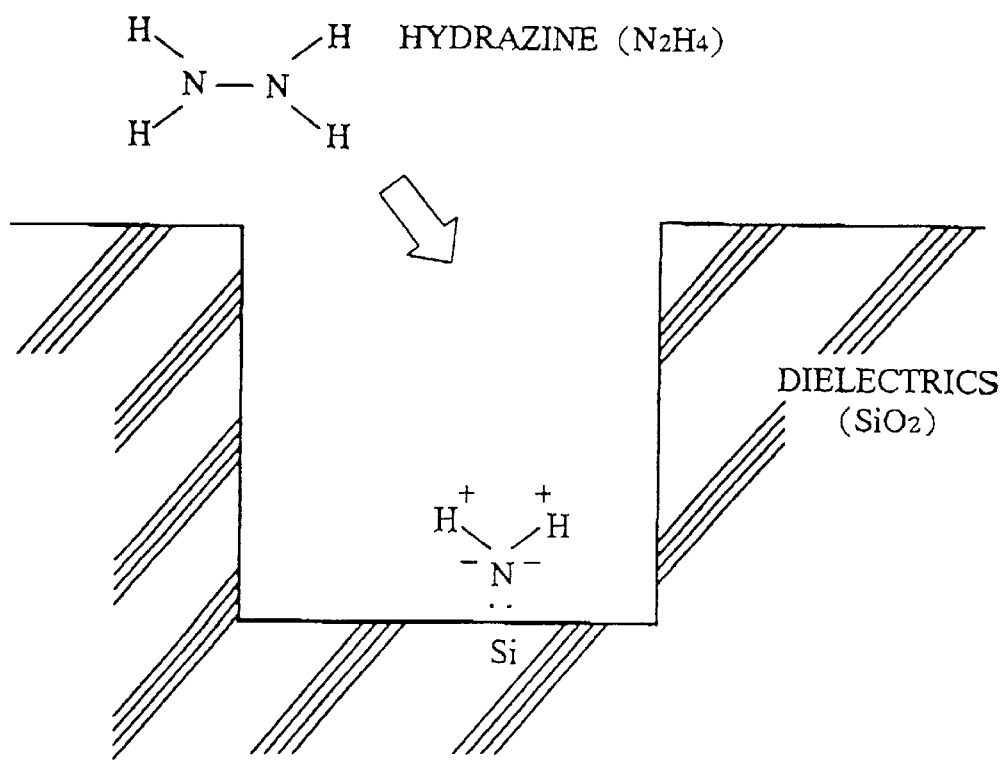
FIG. 5 shows that $NH_2$ is adsorbed to the surface of dielectronics in relation to the example.

The wafer provided with the via hole in the interlayer dielectric film and annealed is carried in the surface treatment unit 1 shown in FIG. 4. The surface treatment unit 1 heats the wafer up to 400° C. from the room temperature, and supplies hydrazine ($N_2H_4$) to the surface of the wafer as shown in FIG. 5. Then, when the hydrazine is contacted with the surface of the via hole, covalent band between nitrogen atoms is disconnected and the hydrazine molecule decomposes into $NH_2$ molecules having an unpaired electron as shown in the following chemical formula (1).

$$N_2H_4 \rightarrow 2NH_2 \tag{1}$$

Since the $NH_2$ molecule has the chemical affinity; the $NH_2$ molecule is adsorbed chemically to the surface of $SiO_2$ as shown in FIG. 5. Here, because an electro-negativity of nitrogen (N) is lager than hydrogen (H), the electron of N—H bond is attracted by the nitrogen (N). Further, the structure of $NH_2$ molecule is not symmetric as the hydrazine. Accordingly, the adsorbed $NH_2$ molecule has polarity, namely, has chemical affinity. In this way, the surface of the via hole having chemical affinity can be made.

Next, the electron donative layer forming unit 2 makes a film consisting of TaN by the CVD method. Concretely, under pressure of 0.1 Torr through 10 Torr, the wafer is heated up to around 300° C. through 500° C. from the room temperature. Then, penta-ethoxide $(Ta(OC_2H_5)_5)$ and ammonia $(NH_3)$ is supplied. Consequently, TaN having an electron donative characteristic is generated on the surface of the via hole by the chemical reaction expressed by chemical formula (2). TaN has a characteristic of metal. As TaN has an electron donative characteristic, TaN is apt to be adsorbed to hydrogen having a positive polarity in the $NH_2$ molecule. Since $NH_2$ molecules act as cores, a film consisting of TaN can be made uniformly. The film of TaN is formed to have thickness of around 5 nm.

Then, by the CVD method, the plug unit 3 plugs the wiring material of Cu (copper) on the wafer with the TaN film formed at the electron donative layer forming unit 2. First, the wafer is heated up to around 150° C. through 400° C. from the room temperature under pressure of 0.1 Torr through 10 Torr. And then, hexafluoro acetylacetonato trimethyl venylsilyl copper (I) (hereinafter, referred to as Cu(tmvs)(hfac)) which is the precursors is supplied. Consequently, Cu is generated on the surface of the via hole by the disproportionation expressed by chemical formula (3).

$$2Cu(tmvs)(hfac) \rightarrow Cu+Cu(hfac)_2+2tmvs \qquad (3)$$

Here, when the diameter of the via hole is, for example, less than around 150 nm, the material can be plugged by the above CVD method. On the other hand, when the diameter of the via hole is large such as more than 150 nm, Cu is deposited as far as 20 mn by the above CVD method, and then Cu is plugged into the via hole by the PVD method or the plating method. This is because of cost-performance due to the structure of apparatus or the speed of forming a film. After Cu has been plugged, the wafer is heated at the temperature of equal to or less than 400° C. for 10 minutes.

Figure 6:
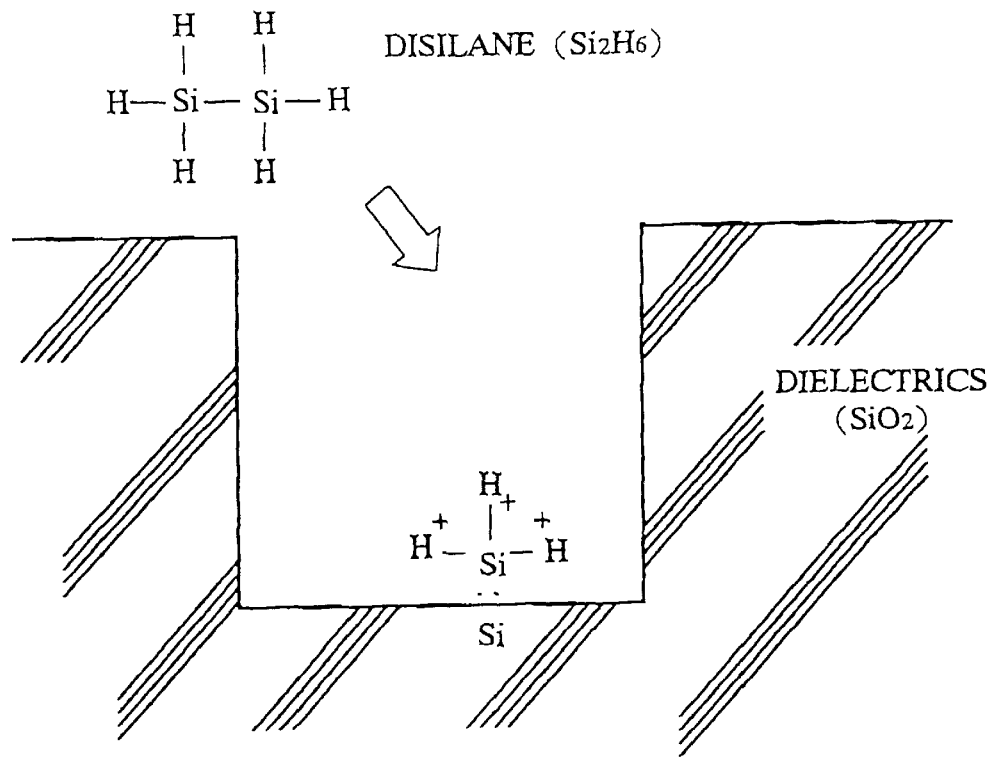
FIG. 6 shows that $SiH_3$ is adsorbed to the surface of dielectronics in relation to the example.
Figure 7:
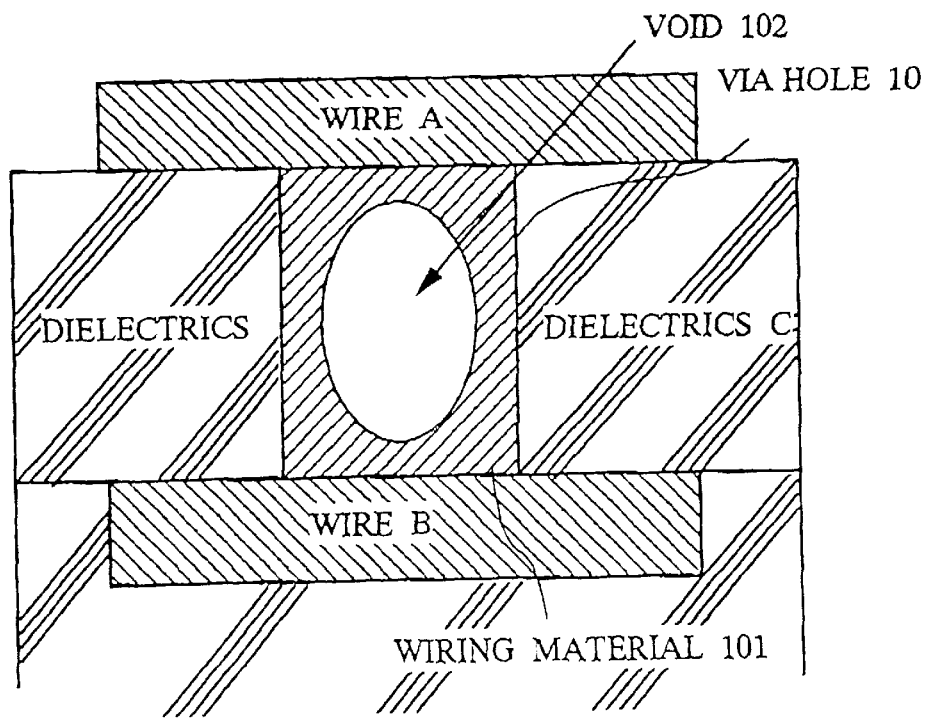
FIG. 7 is an end view simply showing a void generated in the via hole.

Next, a case that Al (aluminum) is plugged will be explained. The wafer provided with the via hole in the interlayer dielectric film and surface treatment unit 1 heats the wafer up to 400° C. from the room temperature, and supplies disilane $(Si_2H_6)$ to the surface of the wafer as shown in FIG. 6. Then, when disilane is contacted with the heated surface of the via hole, covalent bond between silicon atoms is disconnected and disilane molecule decomposes into $SiH_9$ molecules having an unpaired electron as expressed by the following chemical formula (4).

$$Si_2H_6 \rightarrow 2SiH_9 \qquad (4)$$

Since $SiH_9$ molecule has chemical affinity, $SiH_3$ molecule is adsorbed chemically to the surface of $SiO_2$ as shown in FIG. 6. Here, an electro-negativity of silicon (Si) is larger than hydrogen (H), therefore the electron of Si—H bond is attracted by silicon (Si). Further, the structure of $SiH_9$ molecule is not symmetric as disilane. Accordingly, the adsorbed $SiH_9$ molecule has polarity, namely, has chemical affinity. In this way, the surface of the via hole having the chemical affinity can be made.

Next, the electron donative layer forming unit 2 makes a film consisting of TiN by the CVD method. Under pressure of 0.1 Torr through 10 Torr, the wafer is heated up to around 300° C. through 550° C. from the room temperature. And then, titanium tetrachloride $(TiCl_4)$ and ammonium $(NH_3)$ is supplied. Consequently, TiN having an electron donative characteristic is generated on the surface of the via hole by the chemical reaction expressed by chemical formula (5).

$$6TiCl_4+8NH_3 \rightarrow 6TiN+24HCl+N_2 \qquad (5)$$

TiN has a characteristic of metal. As TiN has an electron donative characteristic and is apt to be adsorbed to hydrogen having positive polarity can be made uniformly. The TiN film is made to have thickness of around 10 nm.

Then, by the CVD method, the plug unit 3 plugs the wiring material of Al (aluminum) on the wafer with the TiN film formed in the electron donative layer forming unit 2. First, the wafer is heated up to around 150° C. through 400° C. from the room temperature under pressure of 0.1 Torr through 10 Torr. Next, $HAl(CH_3)$ and hydrogen gas which is precursors is supplied. Consequently, Al is generated on the surface of the via hole by the disproportionation expressed by chemical formula (6).

$$2HAl(CH_3)+H_2 \rightarrow 2Al+4CH_4 \qquad (6)$$

Here, when the diameter of the via hole is, for example, less than around 150 nm, the material can be plugged by the above CVD method. On the other hand, when the diameter of the via hole is large such as equal to or more than 150 nm, an Al film is formed as far as 20 nm by the above CVD method, and then Al is plugged into the via hole by the PVD method or the plating method. This is because of cost-performance due to the structure of apparatus or the speed of forming films. Consequently, after Al is plugged, the via hole is heated at the temperature of less than 400° C. for 10 minutes.

It is sometimes desired to use mixture of copper and aluminum as the wiring material plugged into the via hole instead of element such as copper or aluminum because of request of characteristics of film, for example, electric conductivity. Here, for example, when Cu(tmvs)(hfac) is added so that partial pressure of Cu(tmvs)(hfac) becomes equal to or less than 10% for total pressure of $HAl(CH_3)$ and Cu(tmvs)(hfac), the wiring material including atoms can be made.

In the above example, the surface treatment unit 1, the electron donative layer forming unit 2, and the plug unit 3 are composed into an apparatus for wiring. However, in another way, three apparatuses respectively including three units can be composed into an apparatus for wiring.

The present invention can provide the surface of the via hole produced in the dielectronics with the chemical affinity as described above, which enables to make an initial growth surface uniformly and the wiring material can be plugged sufficiently. Namely, since it is possible to plug the wiring material sufficiently, the invention is effective to prevent increasing the interconnect resistance or disconnection due to the generation of a void.

Further, the invention brings an effect to improve the reliability of conductivity in the wiring by preventing increasing the interconnect resistance or disconnection due to the generation of a void.

Yet further, the invention improves the reliability of multi-layered wiring by providing the reliable plugged wiring (vertical wiring). Accordingly, the invention brings an effect to draw sufficiently a capacity of an integrated circuit comprising semiconductor devices which are highly integrated using the multi-layered wiring.

Having thus described several particular embodiments of the present invention, various alterations, modifications, and improvements will readily occur to those skilled in the art.

Such alterations, modifications, and improvements are intended to be part of this disclosure, and are intended to foregoing description is by way of example only, and is not intended to be limiting. The present invention is limited only as defined in the following claims and the equivalents thereto.

What is claimed is:

1. A wiring method for forming a wiring by plugging wiring material into a via hole produced in dielectronics, the wiring method comprising:

producing the via hole in the dielectronics;

after producing the via hole, cleaning the via hole;

after cleaning the via hole, treating a surface of the via hole by:
 annealing the dielectronics,
 diffusing precursors and supplying a diffused precursor to a surface of the dielectronics,
 dissociating the diffused precursors on the surface of the via hole with heat by the annealing, and
 chemically absorbing a dissociated substance by the dissociating on the surface of the via hole,
 thereby providing chemical affinity to the surface of the via hole and providing higher potentiality of chemical reaction on the surface of the via hole;

after treating the surface of the via hole, forming an electronic donative layer by:
 supplying an electron donating material which has a characteristic for donating an electron to a compound including the wiring material, and
 making an electron donating layer of the electron donating material using chemically absorbed dissociated precursors as a core, leaving a part of the chemically absorbed dissociated precursors on the surface of the via hole,
 thereby the electron donative layer has a characteristic to cause the compound including the wiring material to disproportionate by giving the electron to the compound including the wiring material; and after forming the electron donative layer, plugging the wiring material into the via hole by:
 supplying the compound including the wiring material on the surface of the via hole;
 causing the compound including the wiring material to disproportionate by receiving the electron from the electron donative layer,
 forming a wetting layer having the wiring material by causing the disproportionate,
 supplying the wiring material on a surface of the wetting layer, and
 plugging the wiring material into the via hole by supplying the wiring material.

2. The wiring method according to claim 1, wherein treating the surface of the via hole includes supplying at least one of following precursors to the surface of the via hole:

(a) hydrogen atom, or hydrogen molecule;

(b) hydride, organic compound or complex compound of B (boron), C (carbon), N (nitrogen), P (phosphorus), Si (silicon), Ge (germanium), As (arsenic), Mg (magnesium), Ta (tantalum), Nb (niobium), W (tungsten), Ni (nickel), Cu (copper), Ag (silver), Au (gold);

(c) hydride, organic compound or complex compound composed of diatomic molecule of B, C, N, P, Si, Ge, As, Mg, Ta, Nb, W, Ni, Cu, Ag, and Au;

(d) halogenide of B, C, N, P, Si, Ge, As, Mg, Ta, Nb, W, Ni, Cu, Ag, and Au; or halogenide composed of diatomic molecule of B, C, N, P, Si, Ge, As, Mg, Ta, Nb, W, Ni, Cu, Ag, and Au;

(e) cyclic hydride;

(f) organic compound; and (g) complex compound.

3. The wiring method according to claim 1, wherein the treating surface of the via hole includes making a density of the dissociated substance equal to or more than 1E12/square centimeter.

* * * * *